United States Patent
Remes

(10) Patent No.: US 11,787,357 B2
(45) Date of Patent: Oct. 17, 2023

(54) ENHANCED POWER MANAGEMENT

(71) Applicant: Ford Global Technologies, LLC, Dearborn, MI (US)

(72) Inventor: Enrique Remes, Huixquilucan (MX)

(73) Assignee: Ford Global Technologies, LLC, Dearborn, MI (US)

( * ) Notice: Subject to any disclaimer, the term of this patent is extended or adjusted under 35 U.S.C. 154(b) by 118 days.

(21) Appl. No.: 17/159,206

(22) Filed: Jan. 27, 2021

(65) Prior Publication Data

US 2022/0234529 A1 Jul. 28, 2022

(51) Int. Cl.
*B60R 16/033* (2006.01)
*G01R 31/3835* (2019.01)
*H02J 7/00* (2006.01)
*H02J 9/00* (2006.01)

(52) U.S. Cl.
CPC ........ *B60R 16/033* (2013.01); *G01R 31/3835* (2019.01); *H02J 7/00032* (2020.01); *H02J 9/005* (2013.01)

(58) Field of Classification Search
CPC ............... B60R 16/033; G01R 31/3835; H02J 7/00032; H02J 9/005
USPC ................................................. 307/9.1, 10.1
See application file for complete search history.

(56) References Cited

U.S. PATENT DOCUMENTS

| | | | |
|---|---|---|---|
| 8,013,611 B2 | 9/2011 | Elder et al. | |
| 9,393,920 B2* | 7/2016 | Hosey | H02J 9/002 |
| 9,569,948 B1 | 2/2017 | Platt | |
| 9,772,666 B1 | 9/2017 | Kam et al. | |
| 9,878,960 B2 | 1/2018 | Thompson et al. | |
| 9,884,557 B2 | 2/2018 | Park | |
| 2008/0007205 A1* | 1/2008 | Thimm | F02N 11/0825 320/104 |
| 2009/0082909 A1* | 3/2009 | Sakane | H02H 3/087 700/293 |
| 2011/0125433 A1 | 5/2011 | Schaefer et al. | |
| 2012/0274284 A1 | 11/2012 | Firehammer et al. | |
| 2016/0075324 A1* | 3/2016 | Brombach | B60W 30/1886 701/48 |
| 2018/0236890 A1* | 8/2018 | Cyrne | B60L 3/12 |
| 2018/0304836 A1* | 10/2018 | DeCia | B60H 1/00778 |
| 2019/0210545 A1* | 7/2019 | Sangameswaran | B60R 16/033 |
| 2019/0379218 A1 | 12/2019 | Varughese | |

(Continued)

FOREIGN PATENT DOCUMENTS

CN WO2022011770 * 1/2022

*Primary Examiner* — Rexford N Barnie
*Assistant Examiner* — Xuan Ly
(74) *Attorney, Agent, or Firm* — Brandon Hicks; Bejin Bieneman PLC

(57) ABSTRACT

A computer includes a processor and memory stores instructions executable by the processor to receive a message sent by a first electronic control unit of a deactivated vehicle via a vehicle network of the deactivated vehicle, the message including a power consumption level indicating a rate of power consumption currently used by the first electronic control unit, send a second message to a user device when the power consumption level of the first electronic control unit exceeds a threshold, the second message including a request to deactivate the first electronic control unit, and deactivate the first electronic control unit upon receiving, in response to the request, user input to deactivate the first electronic control unit.

20 Claims, 3 Drawing Sheets

(56) References Cited

U.S. PATENT DOCUMENTS

2020/0057630 A1\* 2/2020 Cho .......................... G06F 8/65
2020/0114768 A1 4/2020 Oestreich et al.

\* cited by examiner

ENHANCED POWER MANAGEMENT

BACKGROUND

Vehicles can use a battery and an internal combustion engine to power vehicle components, including, e.g., a powertrain, a steering rack, etc., during vehicle operation. For example, sensors that collect data while operating, including radar, LIDAR, vision systems, infrared systems, and ultrasonic transducers, consume energy from the battery. When the vehicle is deactivated, one or more components can remain activated, drawing power from the battery that may then be unavailable to reactivate the vehicle.

DETAILED DESCRIPTION

Figure 1:
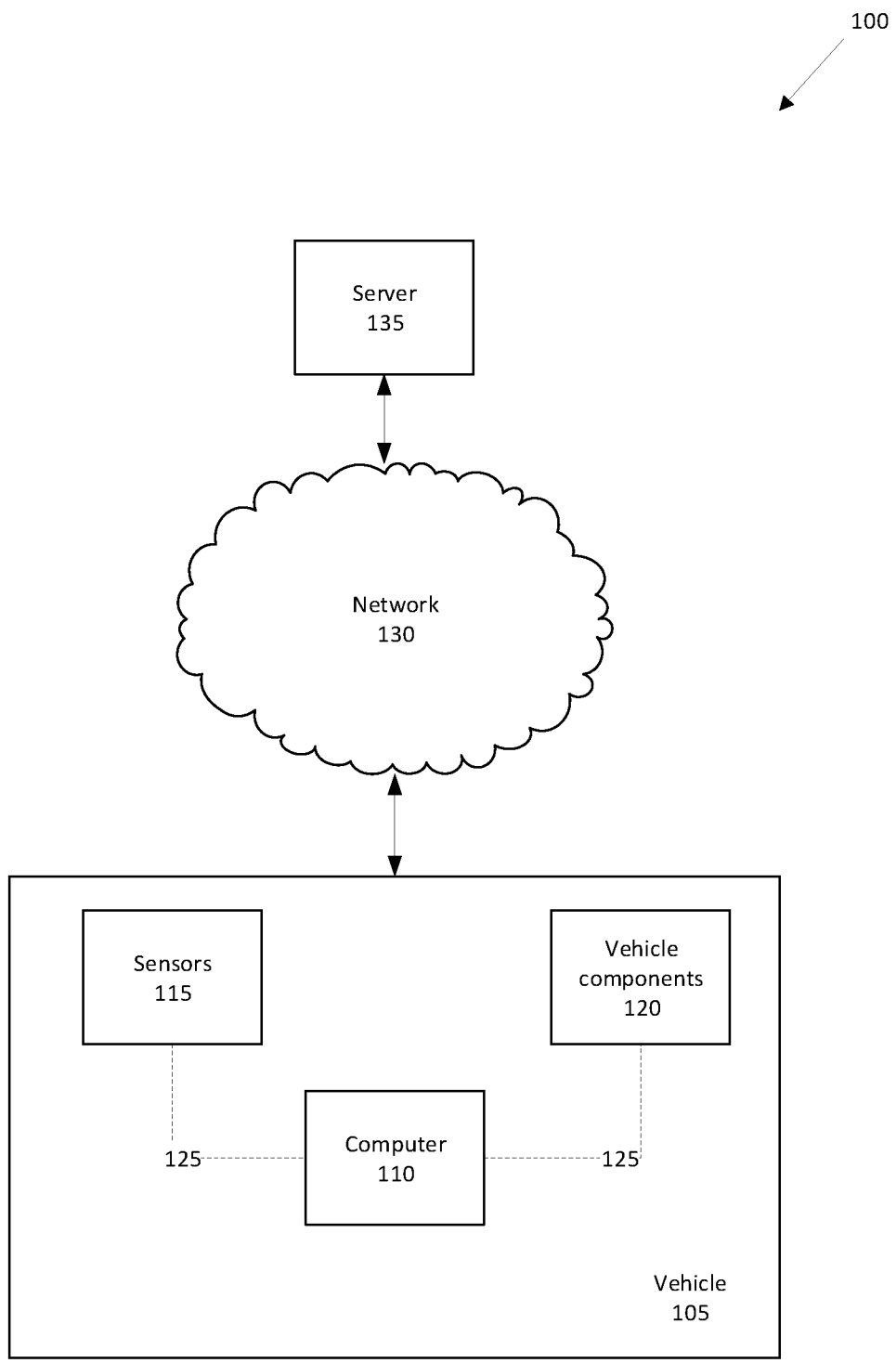
FIG. 1 is a block diagram of an example system for reducing power consumption in a vehicle.

A system includes a computer including a processor and a memory, the memory storing instructions executable by the processor to receive a message sent by a first electronic control unit of a deactivated vehicle via a vehicle network of the deactivated vehicle, the message including a power consumption level indicating a rate of power consumption currently used by the first electronic control unit, send a second message to a user device when the power consumption level of the first electronic control unit exceeds a threshold, the second message including a request to deactivate the first electronic control unit, and deactivate the first electronic control unit upon receiving, in response to the request, user input to deactivate the first electronic control unit.

The instructions can further include instructions to identify a plurality of electronic control units including the first electronic control unit having respective power consumption levels exceeding the threshold and to include, in the second message, a request to deactivate each of the plurality of electronic control units.

The instructions can further include instructions to receive user input to deactivate two or more of the plurality of electronic control units including the first electronic control unit and to deactivate the two or more electronic control units requested by the user.

The power consumption level can be a voltage across the electronic control unit.

The instructions can further include instructions to include an energy level of a vehicle battery in the second message.

The threshold can be based on a predicted time for an energy level of a vehicle battery to fall below an energy threshold.

The energy threshold can be a minimum amount of battery charge to activate the vehicle.

The instructions can further include instructions to store an energy level of a vehicle battery in the memory and to send a third message via the vehicle network to the electronic control unit including the energy level of the vehicle battery.

The instructions can further include instructions to send the energy level to an external server programmed to predict a time for the energy level to fall below a minimum amount of battery charge to activate the vehicle.

The electronic control unit can be further programmed to transition to a low power mode based on the third message.

The instructions can further include instructions to instruct a communications control unit to send the second message to the user device.

The instructions can further include instructions to identify a vehicle component having a power consumption level exceeding the threshold and to include, in the second message, a request to deactivate the vehicle component.

A method includes receiving a message sent by a first electronic control unit of a deactivated vehicle via a vehicle network of the deactivated vehicle, the message including a power consumption level indicating an amount of power used by the first electronic control unit, sending a second message to a user device when the power consumption level of the first electronic control unit exceeds a threshold, the second message including a request to deactivate the first electronic control unit, and deactivating the first electronic control unit upon receiving, in response to the request, user input to deactivate the first electronic control unit.

The method can further include identifying a plurality of electronic control units including the first electronic control unit having respective power consumption levels exceeding the threshold and including, in the second message, a request to deactivate each of the plurality of electronic control units.

The method can further include receiving user input to deactivate two or more of the plurality of electronic control units including the first electronic control unit and deactivating the two or more electronic control units requested by the user.

The method can further include including an energy level of a vehicle battery in the second message.

The method can further include storing an energy level of a vehicle battery in the memory and sending a third message via the vehicle network to the electronic control unit including the energy level of the vehicle battery.

The method can further include sending the energy level to an external server programmed to predict a time for the energy level to fall below a minimum amount of battery charge to activate the vehicle.

The method can further include instructing a communications control unit to send the second message to the user device.

The method can further include identifying a vehicle component having a power consumption level exceeding the threshold and including, in the second message, a request to deactivate the vehicle component.

Further disclosed is a computing device programmed to execute any of the above method steps. Yet further disclosed is a vehicle comprising the computing device. Yet further disclosed is a computer program product, comprising a computer readable medium storing instructions executable by a computer processor, to execute any of the above method steps.

Upon deactivation of a vehicle, components in the vehicle, including electronic control units (ECUs) that operate the components, can enter a low-power mode in which the components use less power than when the vehicle is activated. Because the vehicle is not moving when deactivated, the components do not provide power to movable parts, e.g., servos, actuators, etc. When the vehicle is deactivated, the components in the low-power mode draw power from a vehicle battery.

To reactivate the vehicle, one or more components draw power from the vehicle battery to start a propulsion and reactivate other components for use during vehicle operation. When the components reduce an energy level of the battery while the vehicle is deactivated, the vehicle battery may not have energy to reactivate the vehicle. Thus, the battery energy level should remain above a specified minimum amount of energy to reactivate the vehicle.

While the vehicle is deactivated, one or more of the components may not operate in the low-power mode. For example, an interior light may remain activated, drawing power from the battery to illuminate a passenger cabin. The components thus may drain the energy level of the battery more quickly than in the low-power mode, and the battery may not have enough battery charge to reactivate the vehicle, e.g., upon user input.

By identifying components that may cause the battery energy level to fall below this reactivation threshold and deactivating those components, a computer can preserve the battery charge for reactivating the vehicle. The computer can monitor messages transmitted via a vehicle internal network between the components to determine which components are not in the low-power mode and thus may drain the battery energy level to below the reactivation threshold. The computer can then request user input to deactivate the components, preserving the battery energy level. The computer can communicate with a user device via an external network identifying the components that are drawing power from the vehicle battery and requesting input to deactivate the components. The user can provide input to the user device identifying one or more of the components to deactivate, and the user device can send a message via the external network with the identified components. The computer can deactivate the components identified by the user, preventing further power consumption of the battery by the components.

FIG. 1 illustrates an example system 100 for monitoring and reducing power consumption in a vehicle 105. The vehicle 105 can include a four-wheeled passenger vehicle, e.g., a sedan, a truck, a sport-utility vehicle, etc., and/or a vehicle with more or fewer wheels, e.g., an electric bicycle, a moped, etc. A computer 110 in the vehicle 105 is programmed to receive collected data from one or more sensors 115 and/or vehicle components, such as electronic control units (ECUs) 210 shown in FIG. 2. The computer 110 can be an electronic control unit gateway (ECG), a power control unit (PCU) 200, or a telematics control unit (TCU) 205, as described below. That is, the computer 110 communicates with one or more ECUs 210 to collect and transmit data over a vehicle network 125. For example, the computer 110 can receive data from the vehicle network 125 from the ECUs 210, the data including, e.g., a power consumption level of each ECU 210.

The computer 110 is generally programmed for communications on a vehicle network 125, e.g., including a conventional vehicle 105 communications bus such as a CAN bus, LIN bus, etc., and or other wired and/or wireless technologies, e.g., Ethernet, WIFI, etc. Via the network, bus, and/or other wired or wireless mechanisms (e.g., a wired or wireless local area network in the vehicle 105), the computer 110 may transmit messages to various devices in a vehicle 105 and/or receive messages from the various devices, e.g., controllers, actuators, sensors, etc., including sensors. Alternatively or additionally, in cases where the computer 110 actually comprises multiple devices, the vehicle network 125 may be used for communications between devices represented as the computer 110 in this disclosure. For example, the computer 110 can be a generic computer with a processor and memory as described above and/or may include a dedicated electronic circuit including an ASIC that is manufactured for a particular operation, e.g., an ASIC for processing sensor 115 data and/or communicating the sensor 115 data. In another example, computer 110 may include an FPGA (Field-Programmable Gate Array) which is an integrated circuit manufactured to be configurable by a user. Typically, a hardware description language such as VHDL (Very High Speed Integrated Circuit Hardware Description Language) is used in electronic design automation to describe digital and mixed-signal systems such as FPGA and ASIC. For example, an ASIC is manufactured based on VHDL programming provided pre-manufacturing, whereas logical components inside an FPGA may be configured based on VHDL programming, e.g. stored in a memory electrically connected to the FPGA circuit. In some examples, a combination of processor(s), ASIC(s), and/or FPGA circuits may be included in computer.

In addition, the computer 110 may be programmed for communicating with the vehicle network 125, which, as described below, may include various wired and/or wireless networking technologies, e.g., cellular, Bluetooth®, Bluetooth® Low Energy (BLE), wired and/or wireless packet networks, etc.

The memory can be of any type, e.g., hard disk drives, solid state drives, servers, or any volatile or non-volatile media. The memory can store the collected data sent from the sensors. The memory can be a separate device from the computer 110, and the computer 110 can retrieve information stored by the memory via a network in the vehicle 105, e.g., over a CAN bus, a wireless network, etc. Alternatively or additionally, the memory can be part of the computer 110, e.g., as a memory of the computer.

Sensors 115 can include a variety of devices. For example, various controllers in a vehicle 105 may operate as sensors to provide data via the vehicle network 125 or bus, e.g., data relating to vehicle 105 speed, acceleration, location, subsystem and/or component 120 status, etc. Further, other sensors could include cameras, motion detectors, etc., i.e., sensors to provide data for evaluating a position of a component 120, evaluating a slope of a roadway, etc. The sensors could, without limitation, also include short range radar, long range radar, LIDAR, and/or ultrasonic transducers.

Collected data can include a variety of data collected in a vehicle 105. Examples of collected data are provided above, and moreover, data are generally collected using one or more sensors, and may additionally include data calculated therefrom in the computer 110, and/or at the server 135. In general, collected data may include any data that may be gathered by the sensors and/or computed from such data.

The vehicle 105 includes a plurality of vehicle components 120. In this context, a vehicle component 120 includes one or more hardware components 120 adapted to perform a mechanical function or operation—such as moving the vehicle 105, slowing or stopping the vehicle 105, steering the vehicle 105, etc. Non-limiting examples of components 120 include a propulsion component 120 (that includes, e.g., an internal combustion engine and/or an electric motor, etc.), a transmission component 120, a steering component 120 (e.g., that may include one or more of a steering wheel, a steering rack, etc.), a brake component 120, a park assist component 120, an adaptive cruise control component 120, an adaptive steering component 120, a movable seat, and the like. Components 120 can include computing devices, e.g., ECUs 210 as described below or the like and/or computing devices such as described above with respect to the computer 110, and that likewise communicate via a vehicle network 125.

The system 100 can further include an external network 130 connected to a server 135. The computer 110 can further be programmed to communicate with one or more remote sites such as the server 135, via the external network 130, such remote site possibly including a processor and a memory. The external network 130 represents one or more mechanisms by which a vehicle computer 110 may communicate with a remote server 135. Accordingly, the external network 130 can be one or more of various wired or wireless communication mechanisms, including any desired combination of wired (e.g., cable and fiber) and/or wireless (e.g., cellular, wireless, satellite, microwave, and radio frequency) communication mechanisms and any desired network 130 topology (or topologies when multiple communication mechanisms are utilized). Exemplary communication networks include wireless communication networks (e.g., using Bluetooth®, Bluetooth® Low Energy (BLE), IEEE 802.11, vehicle-to-vehicle (V2V) such as Dedicated Short Range Communications (DSRC), etc.), local area networks (LAN) and/or wide area networks (WAN), including the Internet, providing data communication services.

Figure 2:
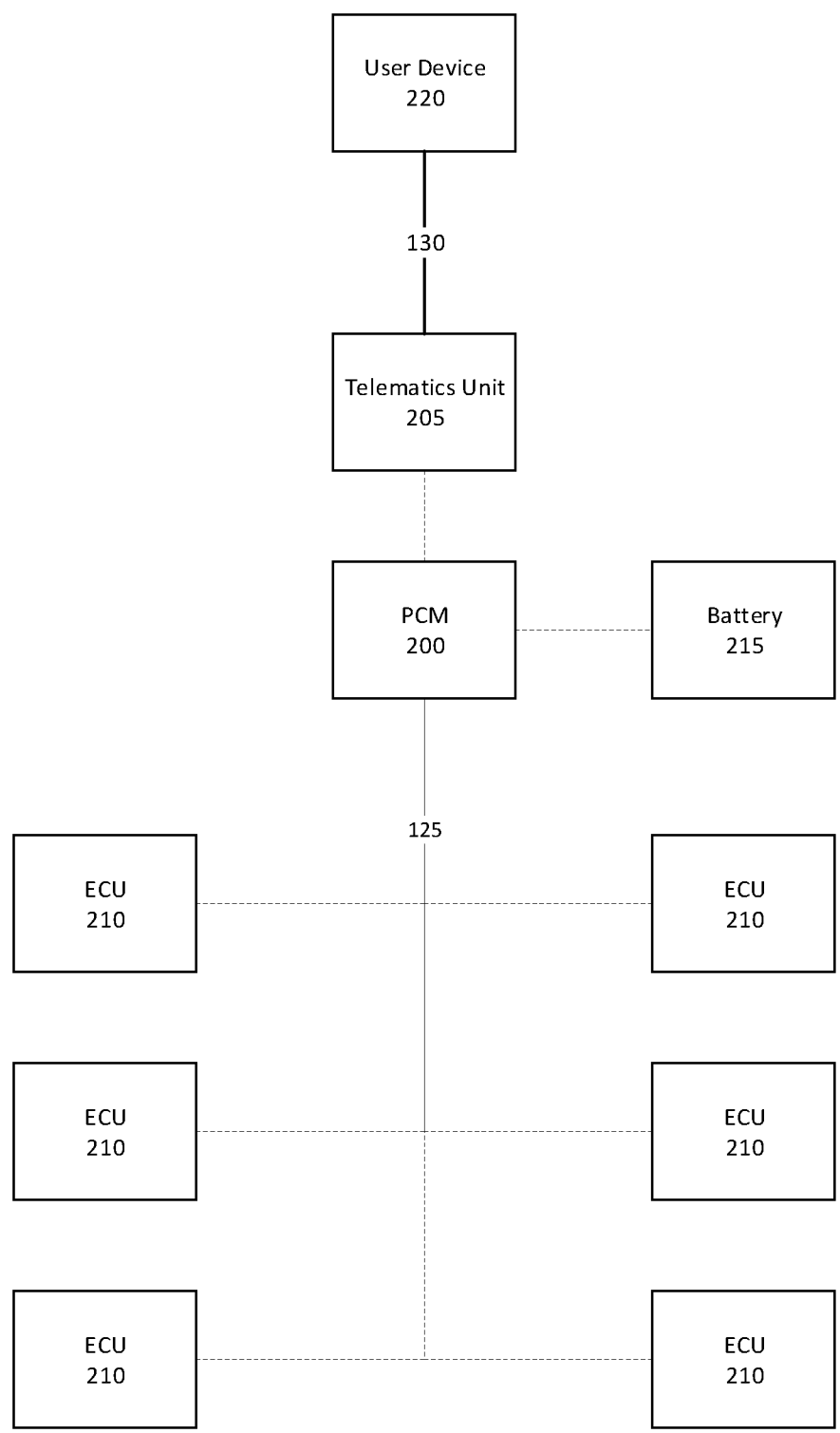
FIG. 2 is a block diagram of a computer communicating with a plurality of electronic control units in a vehicle.

FIG. 2 is a block diagram of the computer 110 communicating with a plurality of ECUs 210 over the vehicle network 125. The computer 110 can include a power control unit (PCU) 200 and a telematics control unit (TCU) 205. The PCU 200 manages power consumption of components 120 and ECUs 210 in the vehicle 105. The TCU 205 is a communications control unit that communicates via the vehicle network 125 (shown in dashed lines) and the external network 130 (shown in a solid line).

Each ECU 210 may be placed in, on, or proximate to one of the vehicle components 120. Each ECU 210 can collect and store data about the components 120. For example, the ECUs 210 can collect and store operation data of the components 120, e.g., a speed at which a propulsion rotates, a steering wheel angle, a brake pressure, etc. The ECUs 210 can transmit the data over the vehicle network 125 to the computer 110. Example ECUs 210 include conventional ECUs such as a Body Control Unit, Engine Control Unit, Electric Power Steering Control Unit, A Human-Machine Interface (HMI), Powertrain Control Module, Seat Control Unit, Speed Control Unit, Telematic Control Unit, Transmission Control Unit, Brake Control Module, and Battery Management System. The Telematics Control Unit (TCU) or Electronic Control Unit Gateway (ECG) are included in the definition of the computer 110 above, but can also be ECUs 210; that is, a telematics control unit or electronic control unit gateway can be configured, e.g., programmed, to carry out operations ascribed herein to the computer 110, as well as performing operations ascribed to the respective ECU 210.

Each ECU 210 can send messages over the network 125 to the PCU 200 and/or other ECUs 210. The message can include data collected by the ECU 210. For example, the ECU 210 can include a power consumption level of the ECU 210 in the message. The "power consumption level" is an amount of electricity used by the ECU 210. For example, the power consumption level can be a voltage difference across the ECU 210, the voltage difference determining a rate of electricity use by Ohm's Law. In another example, the power consumption level can be a rate of energy use determined by the ECU 210. The PCU 200 can use the data in the messages to determine whether to deactivate one or more ECUs 210.

Each ECU 210 can operate in a low power mode, i.e., a "sleep" mode, when the vehicle 105 is deactivated. In this context, a "sleep mode" is programming of the ECU 210 to draw power for less than all operation than when the vehicle 105 is activated. Each ECU 210 can initiate its sleep mode at a specified time after deactivation of the vehicle 105, and the network 125 sends and receives fewer or no messages between the ECUs 210 in respective sleep modes. In the low power mode, the ECU 210 stops drawing power to actuate parts of components 120 that are actuated when the vehicle 105 is activated, e.g., sensors, servos, motors, etc., reducing power consumption of the ECU 210. The ECU 210 thus only draws power for a specific, limited set of operation, e.g., communicating via the network 125.

The vehicle 105 includes at least one battery 215. The battery 215 provides power (i.e., electricity) to the components 120 and ECUs 210 of the vehicle 105. The battery 215 can be, e.g., a lead-acid battery, a lithium-ion battery, a set of battery arrays, etc. The battery 215 has an energy level, i.e., an amount of electricity that the battery 215 can provide to the ECUs 210. When the energy level of the battery 215 falls below a charge threshold, the battery 215 lacks power (electricity) to activate the vehicle 105, e.g., to initiate a propulsion of the vehicle 105. The ECUs 210 can use energy from the battery 215, and the PCU 200 can identify one or more ECUs 210 that can be deactivated to reduce power consumption from the battery 215.

The PCU 200 can store the energy level of the battery 215 in a memory of the computer 110. For example, the PCU 200 can store the energy level as an On-Board Diagnostics Parameter ID (PID) in the memory. The PCU 200 can transmit the energy level PID to the ECUs 210 and/or an external server 135. That is, the PCU 200 can transmit a message via the vehicle network 125 to the ECUs 210, and the TCU 205 can transmit a message to the external server 135 via the external network 130. Upon receiving the energy level PID, the ECUs 210 can transition to a sleep mode, as described above, to reduce power consumption. The external server 135 can, based on the energy level PID, predict a time for the energy level to fall below a minimum amount of battery charge to activate the vehicle 105. That is, the external server 135 can include a charge depletion prediction program that receives the energy level PID as input and outputs a predicted time for the energy level to fall below the charge threshold described above. The charge depletion prediction program can be, e.g., a conventional circuit model.

The TCU 205 can communicate with a user device 220 over the external network 130. A "user device" in the present context is a portable computing device of a user of the vehicle 105, e.g., a smartphone, a tablet, a wearable computing device, a laptop, etc. The user can provide input to the user device 220, e.g., by providing haptic input to a touchscreen display of the user device 220. The user device 220 can transmit the input to the TCU 205 via the external network 130, e.g. as a message sent from the user device 220 to the TCU 205 via the external network 130. The TCU 205 can send a message to the PCU 200 with the user input via the vehicle network 125.

The PCU 200 can receive a message sent by each of the ECUs 210 when the vehicle 105 is deactivated via the vehicle network 125. The message can include a power consumption level, as described above, indicating a rate of power consumption currently used by each ECU 210. When the ECUs 210 continue to draw power from the battery 215 while the vehicle 105 is deactivated, the ECUs 210 may deplete the charge of the battery 215 and the battery 215 may not have enough charge to reactivate the vehicle 105. The PCU 200 can identify each ECU 210 that has a power consumption level exceeding a predetermined threshold. The threshold can be a maximum power consumption that depletes charge of the battery 215 below an energy threshold after a specified period of time. The energy threshold can be, e.g., a minimum amount of battery charge to activate the vehicle 105. The specified period of time can be a maximum time period between deactivation of the vehicle 105 and a subsequent activation of the vehicle 105, e.g., 24 hours, 48 hours, etc.

Upon identifying each ECU 210 having a power consumption level exceeding the threshold, the PCU 200 can instruct the TCU 205 to transmit a message to the user device 220 via the external network 130. The message can include a current energy level of the battery 215, each identified ECU 210, and a request to deactivate each ECU 210. By deactivating the ECUs 210 that exceed the threshold, the PCU 200 can preserve the energy level of the battery 215 until the user reactivates the vehicle 105. The user device 220 can send a message via the external network 130 to the TCU 205 indicating user input to deactivate one or more ECUs 210. The user can provide input selecting one or more of the ECUs 210 identified by the PCU 200 to be deactivated to preserve the charge of the battery 215.

Upon receiving the message from the user device 220, the PCU 200 can deactivate the ECUs 210 identified by the user. To "deactivate" an ECU 210 means that the PCU 200 provides an instruction to the ECU 210 not to draw power from the battery 215. For example, the PCU 200 can instruct the ECU 210 not to draw power from a power network connecting the battery 215 to the ECUs 210. Upon deactivating the ECUs 210 identified by the user, the energy level of the battery 215 can remain above the charge threshold until the user reactivates the vehicle 105.

In addition to the ECUs 210, the PCU 200 can communicate with the computer 110 to identify a vehicle component 120 having a power consumption level exceeding the threshold. That is, parts of the vehicle components 120 other than ECUs 210 can draw power from the battery 215, causing the energy level to drop below the charge threshold. For example, the user may inadvertently leave an external light activated, and the power consumption of a light bulb of the external light can exceed the threshold. The PCU 200 and/or the computer 110 can identify one or more components 120, such as the external light, that have power consumption levels exceeding the threshold. The PCU 200 can instruct the TCU 205 to send the message to the user device 220 identifying the components 120 and requesting input to deactivate the components 120. Upon receiving a message from the user device 220, the PCU 200 can deactivate components 120 identified by the user, i.e., the PCU 200 can instruct the components 120 not to draw power from the battery 215.

Figure 3:
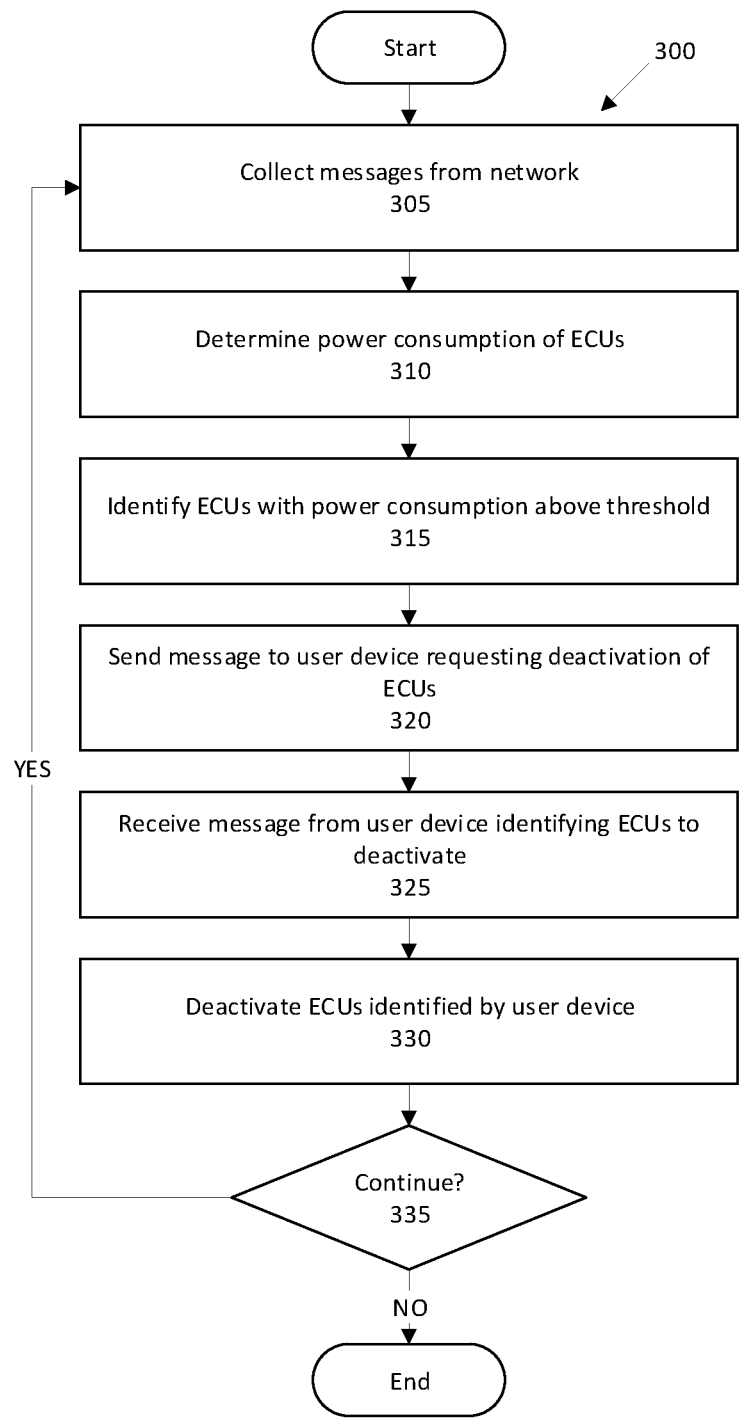
FIG. 3 is a block diagram of an example process for reducing power consumption in the vehicle.

FIG. 3 is a block diagram of an example process 300 for monitoring power in a vehicle 105. The process 300 begins in a block 305, in which a power control unit (PCU) 200 collects messages from a plurality of ECUs 210 via a vehicle network 125. As described above, the PCU 200 includes a processor and a memory and is programmed to manage power consumption of the ECUs 210. The PCU 200 receives messages transmitted via the vehicle network 125 from the ECUs 210. The vehicle network 125 can be an internal network, e.g., a CAN bus.

Next, in a block 310, the PCU 200 determines a respective power consumption level for each ECU 210. As described above, the power consumption level is a rate of power consumption of the ECU 210, i.e., a rate at which the ECU 210 consumes electricity from a battery 215. The power consumption level can be, e.g., a voltage across the ECU 210. The PCU 200 can determine the power consumption level from the messages sent via the vehicle network 125. For example, each message can include a voltage across the ECU 210 that sent the message.

Next, in a block 315, the PCU 200 identifies each ECU 210 that has a power consumption level exceeding a threshold. The threshold can be a specified voltage beyond which a energy level of a battery 215 would deplete to below a charge threshold within a specified period of time. For example, the charge threshold can be a minimum energy level for the battery 215 to activate the vehicle 105, and the specified period of time can be a predicted time between deactivation of the vehicle 105 and reactivation of the vehicle, e.g., 24 hours.

Next, in a block 320, the PCU 200 instructs a telematics control unit (TCU) 205 to send a message via an external network 135 to a user device 220 requesting deactivation of the identified ECUs 210. Deactivating the ECUs 210 reduces power consumption from the battery 215, preserving the energy level of the battery 215 for activation of the vehicle 105. The message can include a current energy level of the battery 215 and a predicted time until the energy level falls below the charge threshold.

Next, in a block 325, the TCU 205 receives a message from the user device 220 identifying one or more ECUs 210 to deactivate. The message can include user input identifying ECUs 210 for the PCU 200 to deactivate to reduce power consumption by the ECUs 210. The user input can identify fewer than all of the ECUs 210 identified by the PCU 200 for deactivation, i.e., the user can determine to deactivate some, but not all, of the ECUs 210 that have respective power consumption levels exceeding the threshold.

Next, in a block 330, the PCU 200 deactivates the ECUs 210 identified in the message from the user device 220. As described above, the PCU 200 deactivates each ECU 210 by instructing the ECU 210 not to draw power from the battery 215. The PCU 200 provides an instruction to each ECU 210 to deactivate until reactivation of the vehicle 105.

Next, in a block 335, the PCU 200 determines whether to continue the process 300. For example, the PCU 200 can determine not to continue the process 300 when a user activates the vehicle 105. If the PCU 200 determines to continue, the process 300 returns to the block 305. Otherwise, the process 300 ends.

Computing devices discussed herein, including the computer 110, include processors and memories, the memories generally each including instructions executable by one or more computing devices such as those identified above, and for carrying out blocks or steps of processes described above. Computer executable instructions may be compiled or interpreted from computer programs created using a variety of programming languages and/or technologies, including, without limitation, and either alone or in combination, Java™, C, C++, Visual Basic, Java Script, Python, Perl, HTML, etc. In general, a processor (e.g., a microprocessor) receives instructions, e.g., from a memory, a computer readable medium, etc., and executes these instructions, thereby performing one or more processes, including one or more of the processes described herein. Such instructions and other data may be stored and transmitted using a variety of computer readable media. A file in the computer 110 is generally a collection of data stored on a computer readable medium, such as a storage medium, a random access memory, etc.

A computer readable medium includes any medium that participates in providing data (e.g., instructions), which may be read by a computer. Such a medium may take many forms, including, but not limited to, non volatile media, volatile media, etc. Non volatile media include, for example, optical or magnetic disks and other persistent memory. Volatile media include dynamic random access memory (DRAM), which typically constitutes a main memory. Common forms of computer readable media include, for example, a floppy disk, a flexible disk, hard disk, magnetic tape, any other magnetic medium, a CD ROM, DVD, any other optical medium, punch cards, paper tape, any other physical medium with patterns of holes, a RAM, a PROM, an EPROM, a FLASH EEPROM, any other memory chip or cartridge, or any other medium from which a computer can read.

With regard to the media, processes, systems, methods, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. For example, in the process 300, one or more of the steps could be omitted, or the steps could be executed in a different order than shown in FIG. 3. In other words, the descriptions of systems and/or processes herein are provided for the purpose of illustrating certain embodiments and should in no way be construed so as to limit the disclosed subject matter.

Accordingly, it is to be understood that the present disclosure, including the above description and the accompanying figures and below claims, is intended to be illustrative and not restrictive. Many embodiments and applications other than the examples provided would be apparent to those of skill in the art upon reading the above description. The scope of the invention should be determined, not with reference to the above description, but should instead be determined with reference to claims appended hereto and/or included in a non-provisional patent application based hereon, along with the full scope of equivalents to which such claims are entitled. It is anticipated and intended that future developments will occur in the arts discussed herein, and that the disclosed systems and methods will be incorporated into such future embodiments. In sum, it should be understood that the disclosed subject matter is capable of modification and variation.

The article "a" modifying a noun should be understood as meaning one or more unless stated otherwise, or context requires otherwise. The phrase "based on" encompasses being partly or entirely based on.

Ordinal adjectives such as "first" and "second" are used throughout this document as identifiers and are not intended to signify importance or order.

The invention claimed is:

1. A system, comprising a computer including a processor and a memory, the memory storing instructions executable by the processor to:
receive a message sent by a first electronic control unit of a deactivated vehicle via a vehicle network of the deactivated vehicle, the message including a power consumption level collected or determined by the first electronic control unit indicating a rate of power consumption currently being used by the first electronic control unit;
send a second message to a user device when the power consumption level of the first electronic control unit exceeds a threshold, the second message including a request to deactivate the first electronic control unit; and
deactivate the first electronic control unit upon receiving, in response to the request, user input to deactivate the first electronic control unit.

2. The system of claim 1, wherein the instructions further include instructions to identify a plurality of electronic control units including the first electronic control unit having respective power consumption levels exceeding the threshold and to include, in the second message, a request to deactivate each of the plurality of electronic control units.

3. The system of claim 2, wherein the instructions further include instructions to receive user input to deactivate two or more of the plurality of electronic control units including the first electronic control unit and to deactivate the two or more electronic control units requested by the user.

4. The system of claim 1, wherein the power consumption level is a voltage across the electronic control unit.

5. The system of claim 1, wherein the instructions further include instructions to include an energy level of a vehicle battery in the second message.

6. The system of claim 1, wherein the threshold is based on a predicted time for an energy level of a vehicle battery to fall below an energy threshold.

7. The system of claim 6, wherein the energy threshold is a minimum amount of battery charge to activate the vehicle.

8. The system of claim 1, wherein the instructions further include instructions to store an energy level of a vehicle battery in the memory and to send a third message via the vehicle network to the electronic control unit including the energy level of the vehicle battery.

9. The system of claim 8, wherein the instructions further include instructions to send the energy level to an external server programmed to predict a time for the energy level to fall below a minimum amount of battery charge to activate the vehicle.

10. The system of claim 8, wherein the electronic control unit is further programmed to transition to a low power mode based on the third message.

11. The system of claim 1, wherein the instructions further include instructions to instruct a communications control unit to send the second message to the user device.

12. The system of claim 1, wherein the instructions further include instructions to identify a vehicle component having a power consumption level exceeding the threshold and to include, in the second message, a request to deactivate the vehicle component.

13. A method, comprising:
receiving a message sent by a first electronic control unit of a deactivated vehicle via a vehicle network of the deactivated vehicle, the message including a power consumption level collected or determined by the first electronic control unit indicating an amount of power currently being used by the first electronic control unit;
sending a second message to a user device when the power consumption level of the first electronic control unit exceeds a threshold, the second message including a request to deactivate the first electronic control unit; and
deactivating the first electronic control unit upon receiving, in response to the request, user input to deactivate the first electronic control unit.

14. The method of claim 13, further comprising identifying a plurality of electronic control units including the first electronic control unit having respective power consumption levels exceeding the threshold and including, in the second message, a request to deactivate each of the plurality of electronic control units.

15. The method of claim 13, wherein the power consumption level is a voltage across the electronic control unit.

16. The method of claim 13, further comprising including an energy level of a vehicle battery in the second message.

17. The method of claim 13, wherein the threshold is based on a predicted time for an energy level of a vehicle battery to fall below an energy threshold.

18. The method of claim 13, further comprising storing an energy level of a vehicle battery in a memory and sending a third message via the vehicle network to the electronic control unit including the energy level of the vehicle battery.

19. The method of claim 18, further comprising sending the energy level to an external server programmed to predict a time for the energy level to fall below a minimum amount of battery charge to activate the vehicle.

20. The method of claim 18, wherein the electronic control unit is further programmed to transition to a low power mode based on the third message.

\* \* \* \* \*